(12) United States Patent
Hom et al.

(10) Patent No.: US 10,868,430 B1
(45) Date of Patent: Dec. 15, 2020

(54) MULTI-BATTERY CHARGING STATION WHICH SELECTIVELY CONNECTS BATTERY SUB-MODULES TO A COMMON POWER BUS FOR CHARGING

(71) Applicant: Wisk Aero LLC, Mountain View, CA (US)

(72) Inventors: Lewis Romeo Hom, Mountain View, CA (US); Brian Robert Viele, Crozet, VA (US); Scott Furman, Menlo Park, CA (US)

(73) Assignee: WISK AERO LLC, Mountain View, CA (US)

( * ) Notice: Subject to any disclaimer, the term of this patent is extended or adjusted under 35 U.S.C. 154(b) by 0 days.

(21) Appl. No.: 16/856,605

(22) Filed: Apr. 23, 2020

Related U.S. Application Data

(63) Continuation of application No. 16/405,218, filed on May 7, 2019, now Pat. No. 10,673,252, which is a continuation of application No. 16/135,851, filed on Sep. 19, 2018, now Pat. No. 10,333,328, which is a continuation of application No. 15/885,303, filed on Jan. 31, 2018, now Pat. No. 10,110,033.

(51) Int. Cl.
*H01M 10/46* (2006.01)
*H02J 7/00* (2006.01)
*H05K 7/20* (2006.01)

(52) U.S. Cl.
CPC ............. *H02J 7/00* (2013.01); *H02J 7/0013* (2013.01); *H02J 7/0069* (2020.01); *H05K 7/20136* (2013.01)

(58) Field of Classification Search
CPC ...... H02J 7/0014; H02J 7/0091; H02J 7/0026; H02J 7/0016; H02J 7/0019; H02J 7/0069; H02J 7/0013
USPC .......................... 320/107, 116, 118, 132, 150
See application file for complete search history.

(56) References Cited

U.S. PATENT DOCUMENTS

| | | | |
|---|---|---|---|
| 10,110,033 B1 | 10/2018 | Hom et al. | |
| 10,333,328 B1 | 6/2019 | Hom et al. | |
| 10,673,252 B2 * | 6/2020 | Hom | H02J 7/0013 |
| 2011/0254502 A1 * | 10/2011 | Yount | B60L 3/0046 320/107 |
| 2013/0015819 A1 | 1/2013 | Nakashima et al. | |

(Continued)

OTHER PUBLICATIONS

U.S. Appl. No. 15/885,303, "Non-Final Office Action," dated Apr. 19, 2018, 6 pages.

(Continued)

*Primary Examiner* — Edward Tso
(74) *Attorney, Agent, or Firm* — Kilpatrick Townsend & Stockton LLP

(57) ABSTRACT

Battery sub-modules are selecting to electrically connect to a common power bus, including by: determining if a discharge-related fault indication for a given battery sub-module indicates that the given battery sub-module is in a discharge-related fault condition. If so, the given battery sub-module is excluded from the selected battery sub-modules such that said given battery sub-module is electrically disconnected from the common power bus. The selected battery sub-modules are configured so that the selected battery sub-modules are electrically connected to the common power bus; the selected battery sub-modules that are electrically connected to the common power bus are charged.

20 Claims, 12 Drawing Sheets

(56) References Cited

U.S. PATENT DOCUMENTS

2017/0353042 A1 12/2017 Liu
2018/0339595 A1* 11/2018 Chang .................... B60L 53/20

OTHER PUBLICATIONS

U.S. Appl. No. 15/885,303, "Notice of Allowance," dated Jul. 27, 2018, 5 pages.
U.S. Appl. No. 16/135,851, "Non-Final Office Action," dated Nov. 28, 2018, 6 pages.
U.S. Appl. No. 16/135,851, "Notice of Allowance," dated Feb. 19, 2019, 5 pages.
U.S. Appl. No. 16/405,218, "Non-Final Office Action," dated Oct. 17, 2019, 7 pages.
U.S. Appl. No. 16/405,218, "Notice of Allowance," dated Jan. 23, 2020, 5 pages.

* cited by examiner

US 10,868,430 B1

MULTI-BATTERY CHARGING STATION WHICH SELECTIVELY CONNECTS BATTERY SUB-MODULES TO A COMMON POWER BUS FOR CHARGING

CROSS REFERENCE TO OTHER APPLICATIONS

This application is a continuation of U.S. patent application Ser. No. 16/405,218, entitled MULTI-BATTERY CHARGING STATION WHICH SELECTIVELY CONNECTS BATTERY SUB-MODULES TO A COMMON POWER BUS FOR CHARGING filed May 7, 2019, which is a continuation of co-pending U.S. patent application Ser. No. 16/135,851, now U.S. Pat. No. 10,333,328, entitled MULTI-BATTERY CHARGING STATION WHICH SELECTIVELY CONNECTS BATTERY SUB-MODULES TO A COMMON POWER BUS FOR CHARGING filed Sep. 19, 2018, which is a continuation of U.S. patent application Ser. No. 15/885,303, now U.S. Pat. No. 10,110,033, entitled MULTI-BATTERY CHARGING STATION WHICH SELECTIVELY CONNECTS BATTERY SUB-MODULES TO A COMMON POWER BUS FOR CHARGING filed Jan. 31, 2018, each of which is incorporated herein by reference for all purposes.

BACKGROUND OF THE INVENTION

New types of aircrafts are being developed which rely solely upon battery power. In some cases, new types of support and/or maintenance systems must also be developed since existing support and/or maintenance systems (e.g., designed for other products) will not work with these new all-electric aircraft.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a charger which charges a battery system with a plurality of battery sub-modules on a common power bus are described herein. In some embodiments, the charger works by receiving, for each battery sub-module in a plurality of battery sub-modules, a metric in order to obtain a plurality of metrics associated with the plurality of battery sub-modules. One or more battery sub-modules to electrically connect to a common power bus using the plurality of metrics are selected from the plurality of battery sub-modules. The selected battery sub-modules are configured so that the selected battery sub-modules are electrically connected to the common power bus and then the selected battery sub-modules that are electrically connected to the common power bus are charged.

Figure 1:
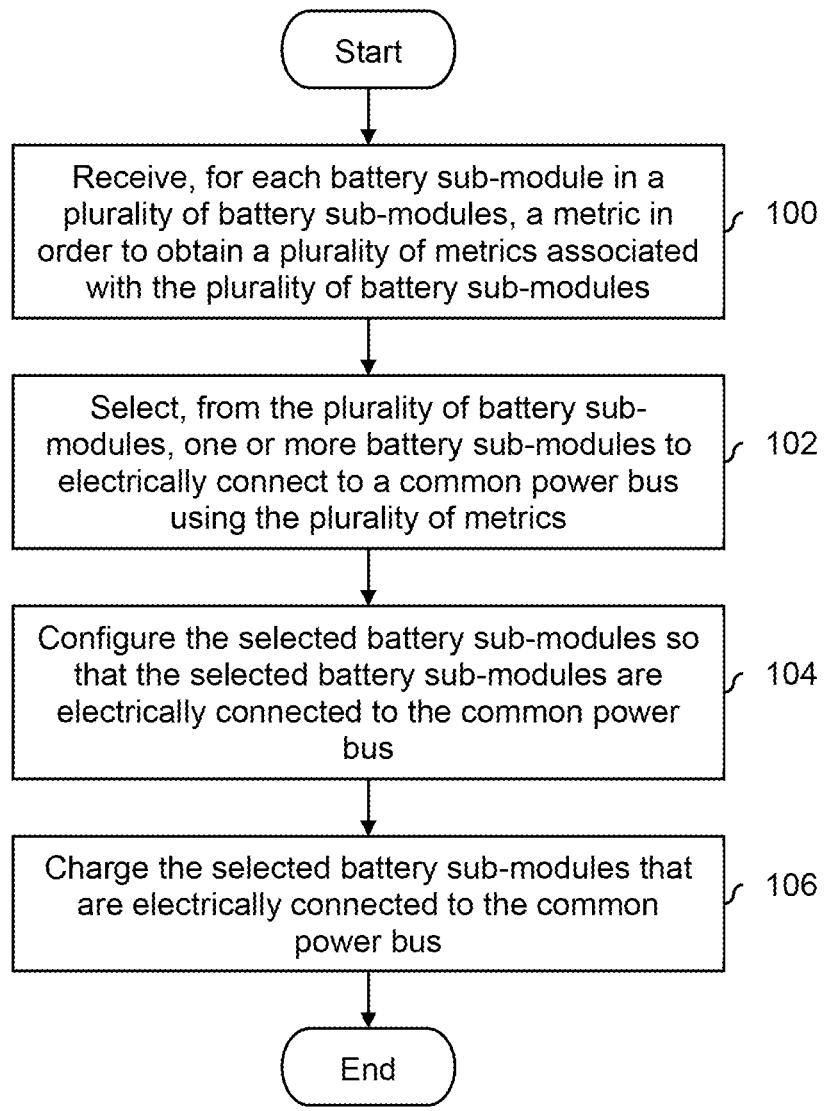
FIG. 1 is a flowchart illustrating an embodiment of a process to charge a battery system with battery sub-modules on a common power bus.

FIG. 1 is a flowchart illustrating an embodiment of a process to charge a battery system with battery sub-modules on a common power bus. In some embodiments, the process is performed by a charger which is external to the battery system. For example, the battery system may be used in an all-electric aircraft and the aircraft is charged at charging stations (e.g., at home, at a workplace, at a hanger/airport, etc.).

At 100, a metric is received for each battery sub-module in a plurality of battery sub-modules in order to obtain a plurality of metrics associated with the plurality of battery sub-modules. For example, the metrics may include metrics associated with battery health (e.g., instantaneous internal resistance, charge capacity, temperature, etc.) and/or metrics associated with a battery's state of charge (e.g., a percentage associated with the degree to which the battery is charged, given that battery's storage capacity).

At 102, one or more battery sub-modules to electrically connect to a common power bus are selected from the plurality of battery sub-modules using the plurality of metrics. Some types of batteries may be damaged if they are charged under certain conditions and in some embodiments the metrics are used to exclude such batteries from charging so as not to damage them. Some examples of this are described in more detail below. In some embodiments, the battery sub-modules are selected to minimize a charging time (e.g., the amount of time required to charge a particular set of selected battery sub-modules) and the metrics are examined to select a set of battery sub-modules which will collectively charge quickly.

At 104, the selected battery sub-modules are configured so that the selected battery sub-modules are electrically connected to the common power bus. For example, a diode (or, more generally, any electrical switch) may be used to selectively connect or disconnect each battery sub-module individually (e.g., independently of the other battery sub-modules) to a shared or common power bus.

In some embodiments, the battery system is used in an all-electric aircraft. To have redundancy in the system (e.g., so the aircraft will not crash), in some embodiments, the battery system includes multiple battery sub-modules which are connected in parallel to a shared or common power bus which supplies power to the electronics (e.g., at a relatively low voltage, such as on the order of 5V) and lift fans (e.g., at a relatively high voltage, such as on the order of 700V). The diodes or switches which are configured at step 104 (e.g., during charging) are the step diodes or switches which may be changed (e.g., when the aircraft is flying) to electrically disconnect a failing battery sub-module from the common power bus in order to keep the aircraft airborne and/or prevent further damage to the power system.

At 106, the selected battery sub-modules that are electrically connected to the common power bus are charged. As will be described in more detail below, in some embodiments, charging settings associated with step 106 are selected and/or configured based on the metrics received at step 100. For example, the charging current and/or charging voltage output by the charger onto the common power bus may be set to values which are selected to prevent damage to the battery sub-modules being charged.

In some embodiments, charging at step 106 includes using a constant current, constant cell voltage (CC, CCV) charging technique or process. CC, CCV charging is attractive because it maximizes capacity while minimizing cell degradation (e.g., where a battery system includes multiple battery sub-modules and each battery sub-module includes multiple cells). An example CC, CCV charging process is described in more detail below.

In some embodiments, charging at step 106 includes balancing. Due to differences in rates at which battery sub-modules are charged up (e.g., two battery sub-modules have slightly different instantaneous internal resistances which cause them to charge at difference rates) and different beginning states of charge levels at the start of charging (e.g., one of the battery sub-modules was decoupled from the common power bus during flight and therefore has a higher state of charge level than another battery sub-module which did remain coupled to the common power bus and did supply power during flight), one battery sub-module may have cell(s) which are approaching a target maximum cell voltage ($V_{cell,target}$) while the cells in another battery sub-module still need to be charged. During balancing, a selected battery sub-module (e.g., the battery sub-module with the highest state of charge which is approaching the target maximum cell voltage) is discharged (e.g., either by dissipating charge across a resistor or by passing it to another battery sub-module (i.e., charge shuttling) while the rest of the battery sub-modules continue to charge).

The process of FIG. 1 may be repeatedly and/or continuously performed if desired so that the battery sub-modules which are being charged change over time. For example, the process of FIG. 1 may be performed a first time when the battery system and charger are first coupled together in order to select and charge an initial set of battery sub-modules. As charging occurs, the process is continuously and/or repeatedly performed to update the selected set of battery sub-modules being charged (e.g., if/as needed) based on real-time and/or updated metrics.

It may be helpful to illustrate the process of FIG. 1 using an exemplary charger and exemplary battery system. The following figure shows one such example.

Figure 2:
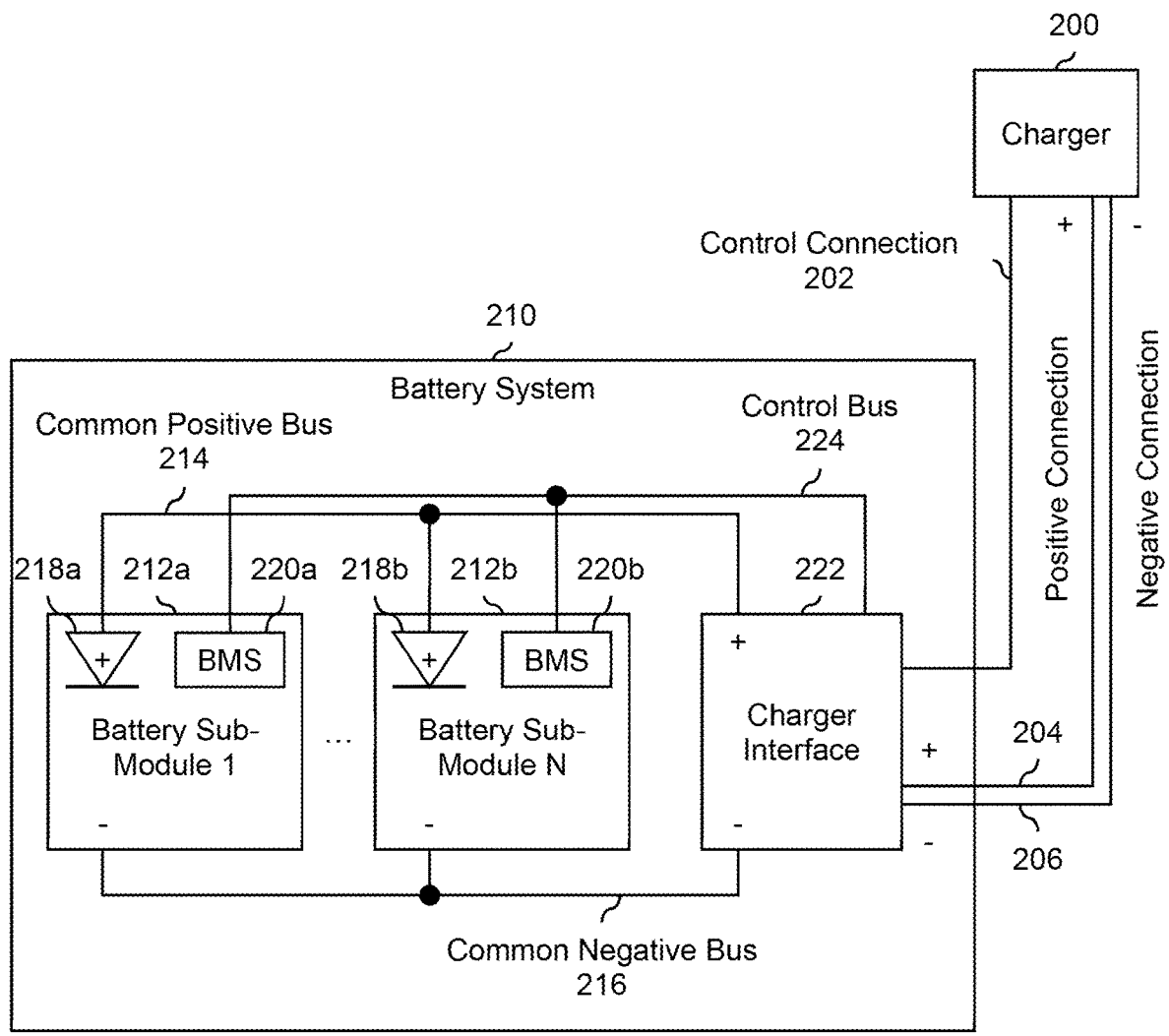
FIG. 2 is a diagram illustrating an embodiment of a charger and a battery system that is being charged.

FIG. 2 is a diagram illustrating an embodiment of a charger and a battery system that is being charged. In the example shown, the charger (200) is physically and electrically connected to the battery system (210) in a removably coupled manner. Generally speaking, there are two types of connections between the charger (200) and the battery system (210): a control connection (202) and connections for power (i.e., positive connection 204 and negative connection 206).

In some embodiments, the battery system is used in an aircraft. Redundancy is an important design consideration in an aircraft and to that end the battery system includes multiple, independent battery sub-modules (212*a* and 212*b*). In some embodiments, each battery sub-module is defined by a container or "can". For safety, if one of the battery sub-modules were to fail while the aircraft was in flight, that sub-module could be electrically disconnected from the common power bus (i.e., common positive bus 214 and common negative bus 216) which would permit the working battery sub-modules to power the aircraft while (electrically) isolating the failing battery sub-modules (e.g., to prevent further damage).

To electrically connect or disconnect each battery sub-module from the common power bus, each battery sub-module includes a diode (218*a* and 218*b*) which may be turned on or off as desired. Although a diode is shown here, any (e.g., electrical) switch may be used to connect or disconnect a battery sub-module from the common power bus.

Each battery sub-module also includes a battery management system (220*a* and 220*b*) which estimates and/or collects a variety of metrics about the corresponding battery sub-module. The metrics are sent from the battery sub-modules (212*a* and 212*b*) to the charger interface (222) via a control bus (224) that is separate from the common power bus (made up of common positive bus 214 and common negative bus 216). Some examples of the collected metrics are described in more detail below. In various embodiments, the battery management systems (220*a* and 220*b*) continuously or periodically push metrics up to the charger interface (222).

Within the battery system, the charger interface (222) is the module that the charger (e.g., directly) connects to and communicates with. In turn, the charger interface uploads information from the rest of the battery system to the charger (e.g., metrics from battery management system (BMS) 220*a* and 220*b*) and configures the diodes (218*a* and 218*b*) in response to the instructions from the charger 200. To put it another way, in this example, the charger (200) is the master and the charger interface (222) is the slave. Naturally, some other embodiments may be configured differently (e.g., the charger offloads some control and/or decision making about charging to the charger interface).

Referring back to FIG. 1, charger 200 is one example of a device or component which performs the process of FIG. 1. For example, at step 100 in FIG. 1, charger 200 receives metrics which are estimated and/or collected by the battery management systems (220*a* and 220*b*) and which are related to the corresponding battery sub-modules. These metrics are uploaded to the charger via the charger interface (222). Using these metrics, the charger at step 102 then selects which battery sub-modules (e.g., 212*a* and/or 212*b*) to connect to the common power bus (e.g., common positive bus 214 and common negative bus 216) and configures the diodes (218*a* and 218*b*) accordingly. The charger then charges the connected battery sub-modules by sending charge down positive connection 204 and negative connection 206 which in turn drives common positive bus 214 and common negative bus 216.

The following figure describes some examples of metrics and how the exemplary metrics may be used to select which battery sub-modules to connect to the common power bus.

Figure 3:
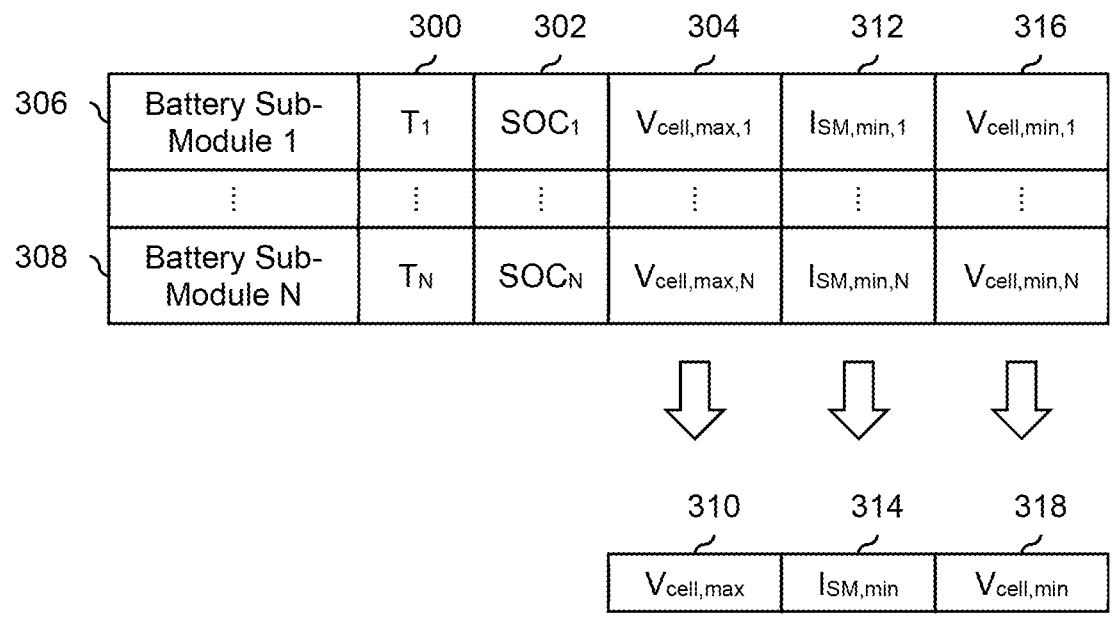
FIG. 3 is a table illustrating an embodiment of metrics associated with a plurality of battery sub-modules.

FIG. 3 is a table illustrating an embodiment of metrics associated with a plurality of battery sub-modules. These metrics are some examples of metrics which are received at step 100 in FIG. 1 and are used to select which battery sub-modules to connect to the common power bus at step 102 in FIG. 1.

Each row in the table contains metrics for a particular battery sub-module. For example, in FIG. 2, battery management system 220*a* may estimate and/or collect metrics for the first battery sub-module (212*a*), battery management system 220*b* may estimate and/or collect metrics for the n$^{th}$ battery sub-module (212*b*), etc. The metrics in the table include temperature ($T_i$) in column 300, state of charge ($SOC_i$) in column 302 (e.g., a percentage), maximum cell voltage ($V_{cell,max,i}$) in column 304, and minimum (battery) sub-module current ($I_{SM,min,i}$) in column 312 for each battery sub-module in the system. These metrics are dynamic values and are updated continuously and/or periodically to reflect current values (e.g., a battery management system may be configured to continuously and/or periodically output updated metrics for its battery sub-module).

The maximum cell voltages ($V_{cell,max,i}$) in column 304 relate to voltages at the cell level for each of the respective battery sub-modules. In this example, each battery sub-module (e.g., 212*a* and 212*b* in FIG. 2) contains multiple cells (not shown in FIG. 2) where each cell can have a different voltage. The maximum cell voltage for a given battery sub-module ($V_{cell,max,i}$) is the (e.g., measured) voltage of the cell with the maximum voltage in that battery sub-module. For example, $V_{cell,max,1}$ is the maximum cell voltage in the first battery sub-module (see row 306), $V_{cell,max,N}$ is the maximum cell voltage in the N$^{th}$ battery sub-module (see row 308), etc.

From all of the maximum cell voltages in column 304, a (e.g., global) maximum cell voltage ($V_{cell,max}$) is obtained (310) by selecting the maximum value from that column (i.e., $V_{cell,max}=\max(V_{cell,max,i})$ across all i). As will be described in more detail below, the maximum cell voltage is used to configure a setting and/or parameter associated with charging the battery system.

The sub-module currents ($I_{SM,i}$) in column 312 relate to the currents which pass through the battery sub-module. Since these metrics relate to and/or are measured doing charging, the values in this column are all negative. (In contrast, during flight, these currents would have positive values since the battery sub-modules would be supplying power to the lift fans.) The values in this column are the (e.g., measured) currents being input by a particular battery sub-module. For example, as FIG. 2 shows, since the battery sub-modules are connected in parallel, the charger outputs some total charge, of which the first battery sub-module inputs $I_{SM,i}$ (see row 306), the Nth battery sub-module inputs $I_{SM,N}$ (see row 308), etc.

From these (e.g., measured) sub-module currents in column 312, a minimum sub-module current (i.e., $I_{SM,min}$ (314)) is obtained by selecting the minimum value (i.e., $I_{SM,min}=\min(I_{SM,i})$ across all i). Note that since the values in column 312 are all negative (since they are measured during charging), this corresponds to selecting the current with the largest magnitude. As will be described in more detail below, the minimum sub-module current is used to configure a setting and/or parameter associated with charging the battery system.

The metrics in column 316 are the minimum cell voltages for each of the battery sub-modules. As with the maximum cell voltages, these voltage are at the cell level and represent the minimum voltage of a cell within a particular battery sub-module. From these minimum cell voltages for each of the battery sub-modules (316), a global minimum cell voltage (318) is obtained by selecting the minimum. As will be described in more detail below, in some embodiments, the global minimum cell voltage (318) is used during a charge-and-update process.

In this example, the battery sub-modules can be damaged if they are charged under certain conditions. For example, with regard to temperature, a battery sub-module can be damaged if it is charged while that battery sub-module is too hot or too cold. As such, the temperature of each battery sub-module (e.g., in column 300) is compared against a range of (e.g., acceptable charging) temperatures and a given battery sub-module is not connected to the common power bus (e.g., for charging) unless its temperature is within the range (e.g., between 0° C. and 60° C.). It is noted that this temperature check is a necessary but not sufficient condition to be selected for charging. For example, a given battery sub-module may pass the temperature check but may not be selected for charging because some other metric associated with that battery sub-module failed an associated test.

A battery sub-module can also be damaged if it is overcharged. To prevent this, the state of charge (e.g., which is a percentage between 0% and 100% associated with the degree to which the battery sub-module is charged) for each battery sub-module is compared against a threshold. For example, if a particular battery sub-module exceeds some charge threshold (e.g., 100%), that battery sub-module will not be connected to the common power bus for charging.

These examples are described below more formally and/or generally in a flowchart.

Figure 4:
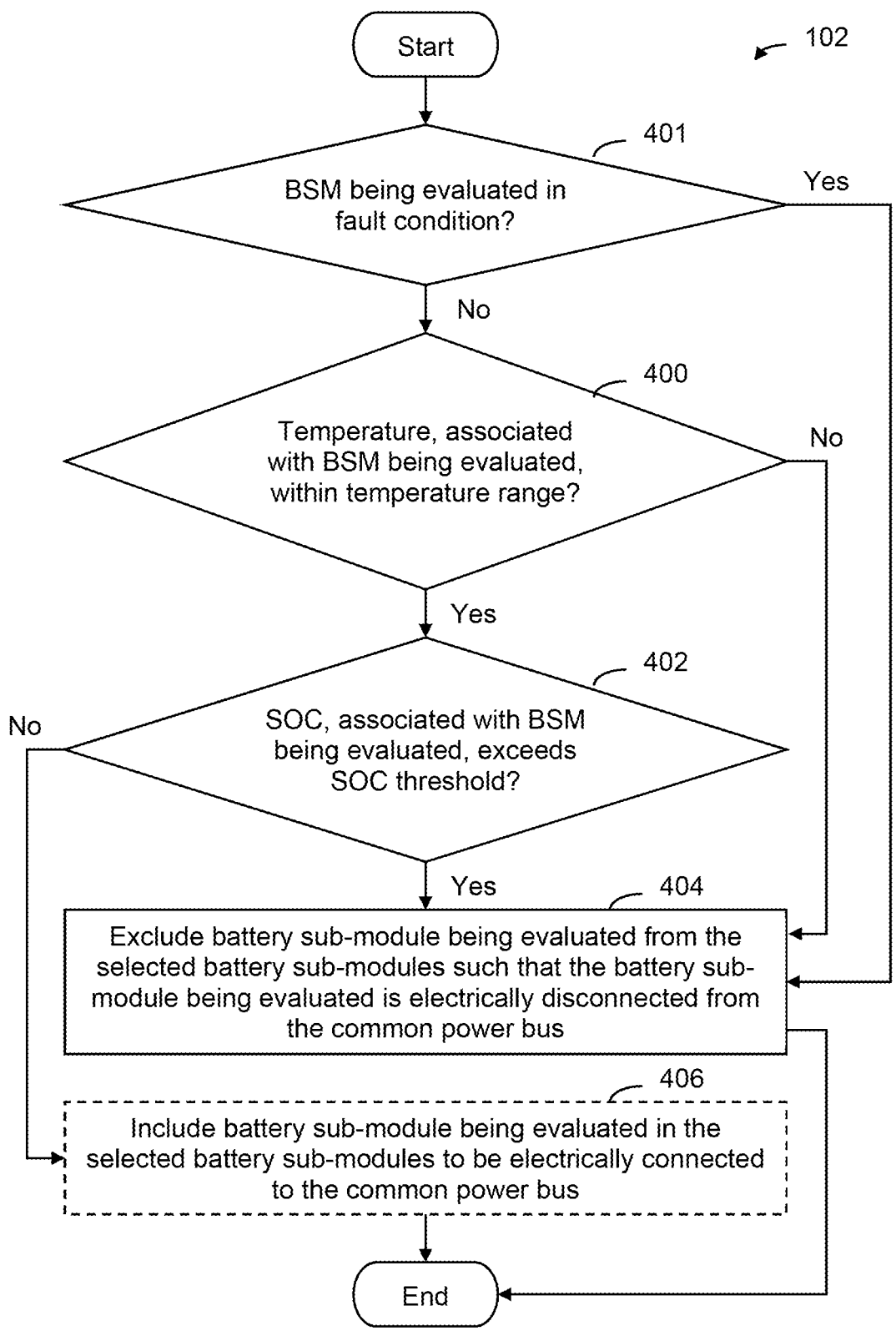
FIG. 4 is flowchart illustrating an embodiment of a process to select battery sub-modules to electrically connect to a common power bus for charging.

FIG. 4 is flowchart illustrating an embodiment of a process to select battery sub-modules to electrically connect to a common power bus for charging. In some embodiments, the process of FIG. 4 is used at step 102 in FIG. 1. In this example, the plurality of metrics include a temperature and a state of charge (e.g., for each battery sub-module in the plurality of battery sub-modules). For simplicity, the process of FIG. 4 describes exemplary checks performed on a single battery sub-module to prevent damage during charging; this process may be repeated on each battery sub-module.

At 401, it is determined whether the battery sub-module (BSM) being evaluated is in a fault condition. Generally speaking, a fault condition is a safety check to ensure none of the battery sub-modules will be damaged and/or cause damage if charged. For example, if a battery sub-module was completely discharged to 0V and remained discharged for a relatively long period of time (e.g., a week) it would be dangerous to charge (e.g., even though temperature and/or voltage checks may be satisfied) because the battery sub-module could have degraded during that time. In some embodiments, a built-in battery management system checks for fault conditions and reports if the battery sub-module was in such a state.

If the battery sub-module is determined to be in a fault condition at 401, then battery sub-module being evaluated is excluded from the selected battery sub-modules such that the battery sub-module being evaluated is electrically disconnected from the common power bus at 404.

If the battery sub-module is determined to not be in a fault condition at 401, then at 400, it is determined whether a temperature, associated with a battery sub-module (BSM) being evaluated, is within a temperature range. As described above, the temperature range may describe temperatures at which it is acceptable to charge a corresponding battery sub-module; some example ranges and/or values are described above.

If it is determined that the temperature is within the temperature range at step 400, then at 402 it is determined whether a state of charge (SOC), associated with the battery sub-module (BSM) being evaluated, exceeds a state of charge threshold.

If it is determined that the temperature is outside of the temperature range at 400 or if it is determined that the state of charge exceeds the state of charge threshold at 402, the battery sub-module being evaluated is excluded from the selected battery sub-modules such that the battery sub-module being evaluated is electrically disconnected from the common power bus at 404. For example, if $T_1$ in column 300 of FIG. 3 was outside of some acceptable temperature range, or if $SOC_1$ in column 302 of FIG. 3 exceeded some state of charge threshold, then the first battery sub-module (e.g., 212a in FIG. 2) would not be electrically connected to the common power bus (e.g., diode 218a would be configured so that battery sub-module 212a is not connected to common positive bus 214).

If it is determined that the state of charge does not exceed the state of charge threshold at 402, the battery sub-module being evaluated is included in the selected battery sub-modules to be electrically connected to the common power bus at 406. In this example, only a temperature check and a state of charge check are performed. In some other embodiments, there are additional checks which the battery sub-module being evaluated would need to pass before being included at step 406. Note, for example, that step 406 has a dashed outline to indicate that step 406 might not be performed in other embodiments and/or under some conditions.

The process of FIG. 4 may be performed continuously and/or periodically during charging. For example, the process may be used to select an initial set of battery sub-modules to connect at the beginning of charging. Then, during charging, the process is performed again in case the temperature and/or state of charge of a battery sub-module reaches a dangerous level where charging could damage that battery sub-module.

As described above, in some embodiments, metrics are used to configure a setting or parameter associated with charging. The following figures describe an example of this.

Figure 5:
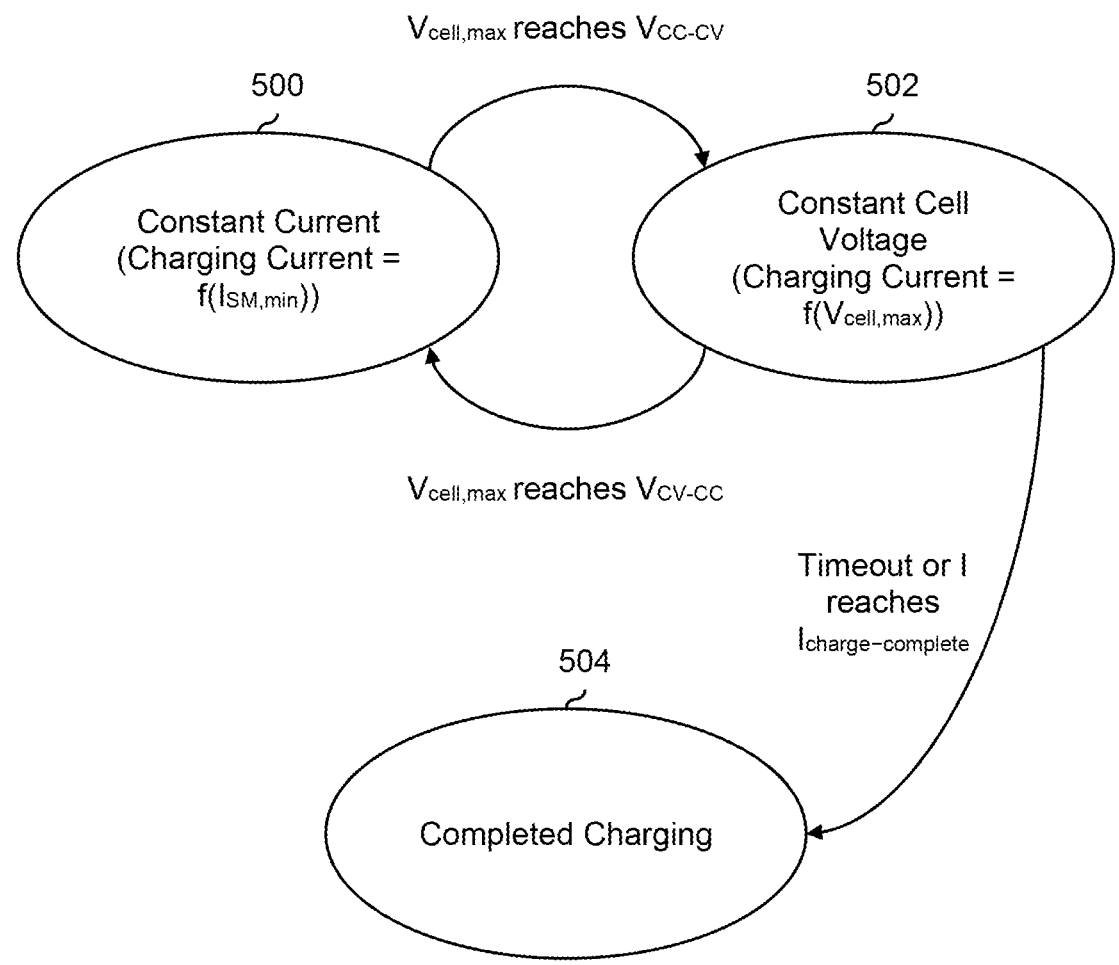
FIG. 5 is a diagram illustrating an embodiment of a state machine associated with charging.

FIG. 5 is a diagram illustrating an embodiment of a state machine associated with charging. In this example, the charging process begins in constant current state 500 where the charger (e.g., 200 in FIG. 2) attempts to maintain a constant charging current of $I_{CC}$ (e.g., sometimes referred to as the maximum charging current) to each of the battery sub-modules (e.g., 212a and 212b in FIG. 2). More specifically, the charging current (I) at index k is set in this example using the equations:

$$I_{error} = I_{CC} - I_{SM,min} \quad (1)$$

$$I_k = I_{k-1} - k_I I_{error}$$

where $I_{error}$ is the current error, $I_{CC}$ is the value of the constant charging current which the charger attempts to provide to each battery sub-module, $I_{SM,min}$ is the minimum sub-module current (see $I_{SM,min}$ 314 in FIG. 3), $I_k$ is the (e.g., total) charging current output by the charger at index k, $I_{k-1}$ is the (e.g., total) charging current output by the charger at index k−1, and $k_I$ is a control constant (e.g., $k_I=1$). Note that there is no error (i.e., the system is operating perfectly) when $I_{CC}=I_{SM,min}$ (that is, when all of the battery sub-modules are receiving a charging current of at least $I_{CC}$). In some embodiments, the value of $I_{CC}$ is a configurable setting in charger 200. In some embodiments, the value of $I_{CC}$ is user specified (e.g., a user can override a default setting if there is a queue for the charger).

Since $I_{CC}$ and $k_I$ are constant or fixed values, a more general way of expressing Equation (1) and (2) is to say that the charging current output by the charger (e.g., 200 in FIG. 2) is a function of the metric $I_{SM,min}$ during this mode (500).

Once the maximum cell voltage (i.e., $V_{cell,max}$) reaches a threshold for switching from the constant current state to the constant cell voltage state (i.e., $V_{CV-CC}$), the charger switches from state 500 to constant cell voltage state 502. In one example, $V_{CV-CC}=4.25V$. As described above, a battery sub-module may become damaged if it is charged too much. To prevent this, when the maximum cell voltage (i.e., $V_{cell,max}$) gets to $V_{CV-CC}$, the charger will switch to charging in this mode to prevent damage. In this state 502, the charger sets its charging current to a value that maintains $V_{cell,max}$ at a target maximum cell voltage (i.e., $V_{cell,target}$). In one example, $V_{cell,target}=4.40V$. Since $V_{cell,max}$ is being maintained at some desired cell voltage (e.g., as opposed to the voltage across the battery sub-modules), this state is referred to as the constant cell voltage state.

More formally, the charger sets its charging current at index k to be:

$$V_{error} = V_{cell,target} - V_{cell,max} \quad (3)$$

$$I_k = I_{k-1} - k_V V_{error} \quad (4)$$

where $V_{error}$ is the (e.g., cell-level) voltage error, $V_{cell,target}$ is the target maximum cell voltage (e.g., which may be user specified or obtained from a register), $V_{cell,max}$ is the maximum cell voltage (see metric 310 in FIG. 3), k is the charging current (e.g., output by the charger) at index k, $I_{k-1}$ is the charging current (e.g., output by the charger) at index k−1, and $k_V$ is a control constant (e.g., $k_V=50$ A/V). Generally speaking, the charger voltage is a function of $V_{cell,max}$ since $V_{cell,target}$ and $k_V$ are constant or fixed values.

If, while in state 502, a timeout is reached (e.g., the charging time exceeds $t_{max}$, which in one example is 18000 seconds) or the charging current output by the charger drops to a current level at which charging is considered complete (e.g., $I=I_{charge-complete}$ where in one example, $I_{charge-complete}=-0.05$ A). The latter check may be to stop charging when the charging current slows to a trickle. The charging process then goes into completed charging state (504) where the charger stops charging the battery system (i.e., outputs a charging current of OA).

Returning briefly to FIG. 1, for context, constant current state 500 and constant cell voltage state 502 may coincide with step 106 in FIG. 1, where the metrics described above are used to set the charger (output) current (see state 500) or the charger (output) voltage (see state 502) during charging at step 106 in FIG. 1. The following figure describes this example more formally and/or generally.

Alternatively, when in state 502, the charger can return to state 500 if $V_{cell,max}$ reaches $V_{CV-CC}$. In this example, $V_{CV-CC}$ is strictly lower than $V_{CC-CV}$. This establishes hysteresis between state 500 and state 502 so that the charger does not rapidly oscillating between the two states. It is noted that $V_{cell,max}$ is typically expected to increase so a state change from state 502 back to state 500 is atypical (e.g., assuming everything is functioning normally).

Figure 6:
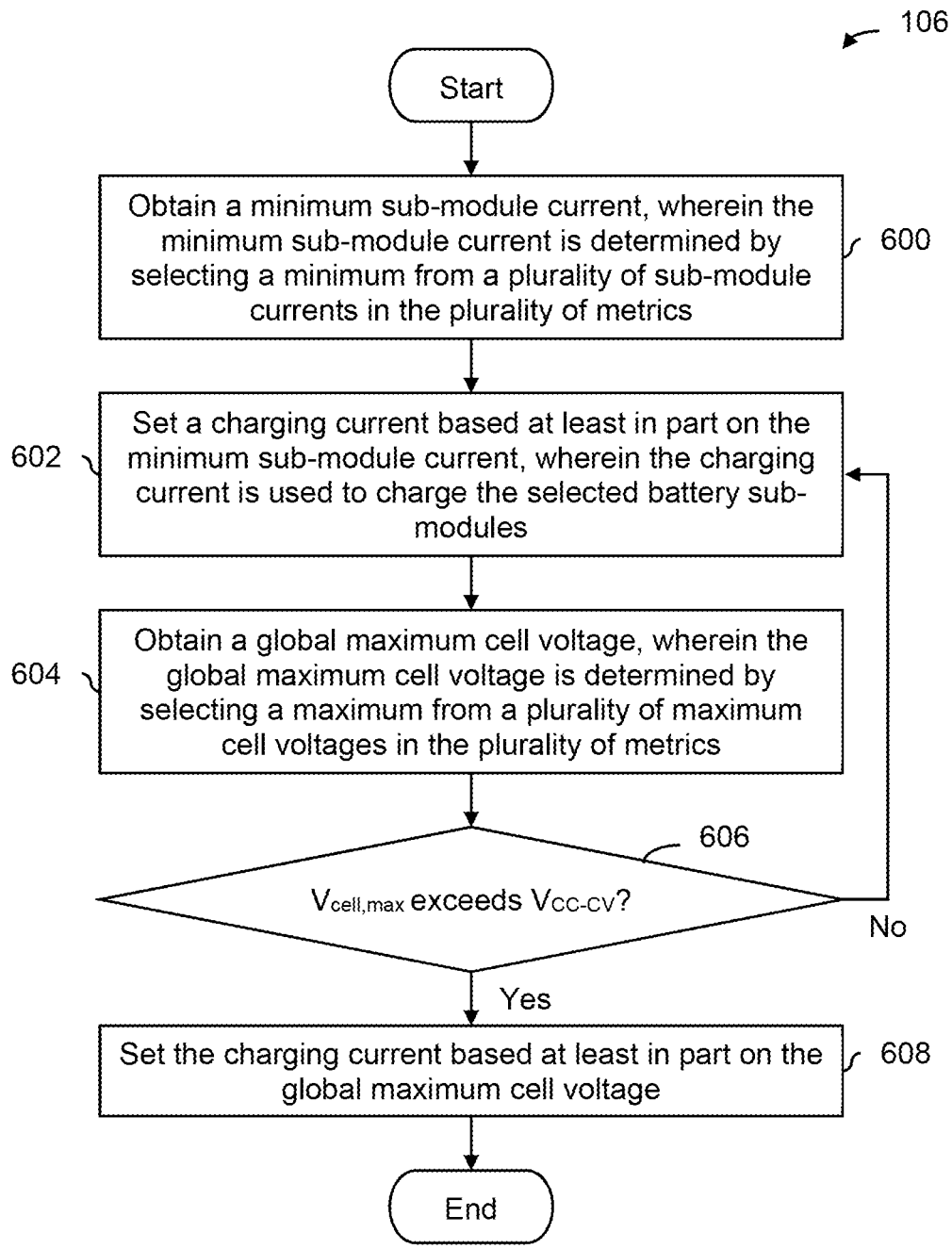
FIG. 6 is a flowchart illustrating an embodiment of a process to set a charge-related setting using the plurality of metrics.

FIG. 6 is a flowchart illustrating an embodiment of a process to set a charge-related setting using the plurality of metrics. In some embodiments, the process of FIG. 6 is used during step 106 in FIG. 1. In some embodiments, the process is performed by charger 200 in FIG. 2.

At 600, a minimum sub-module current is obtained, wherein the minimum sub-module current is determined by selecting a minimum from a plurality of sub-module currents in the plurality of metrics. For example, in FIG. 3, sub-module currents are reported for each of the battery sub-modules (see column 312). Minimum sub-module current 314 is obtained by selecting the minimum value from the metrics in column 312.

At 602, a charging current is set based at least in part on the minimum sub-module current, wherein the charging current is used to charge the selected battery sub-modules. In the example of FIG. 5, the system would be in state 500 where the charging current (e.g., k at index or time k) is based on $I_{SM,min}$ (see Equations 1 and 2 above). In FIG. 2, this amount or level of charging current would be output by charger 200.

At 604, a global maximum cell voltage is obtained, wherein the global maximum cell voltage is determined by selecting a maximum from a plurality of maximum cell voltages in the plurality of metrics. $V_{cell,max}$ (310) in FIG. 3 shows one example of a global maximum where $V_{cell,max}$ (310) is obtained by selecting the maximum from $V_{cell,max,1}$ from column 304.

At 606, it is determined if the global maximum cell voltage ($V_{cell,max}$) exceeds a voltage threshold ($V_{CC-CV}$). As described above, this is an indication that the cells in the sub-modules are approaching levels where they could become damaged due to overcharging and a different charging strategy is now called for (e.g., a constant cell voltage charging mode).

If so, at 608, the charging current is set based at least in part on the global maximum cell voltage. For example, in FIG. 5, this corresponds to switching to constant cell voltage state 502 from constant current state 500; Equations 3 and 4 describe how the charging current is determined (at least for that example).

If the global maximum cell voltage ($V_{cell,max}$) does not exceed the voltage threshold ($V_{CC-CV}$) at 606, the charging current continues to be set based at least in part on the minimum sub-module current at step 602.

Returning briefly to FIG. 4, in that example, a battery sub-module is disconnected from the common power bus (and thus preventing charging of that battery sub-module) if that battery sub-module was too hot or too cold. The following figures show some examples of components and/ or techniques to heat or cool (e.g., selected) battery sub-modules so that they can be charged.

Figure 7:
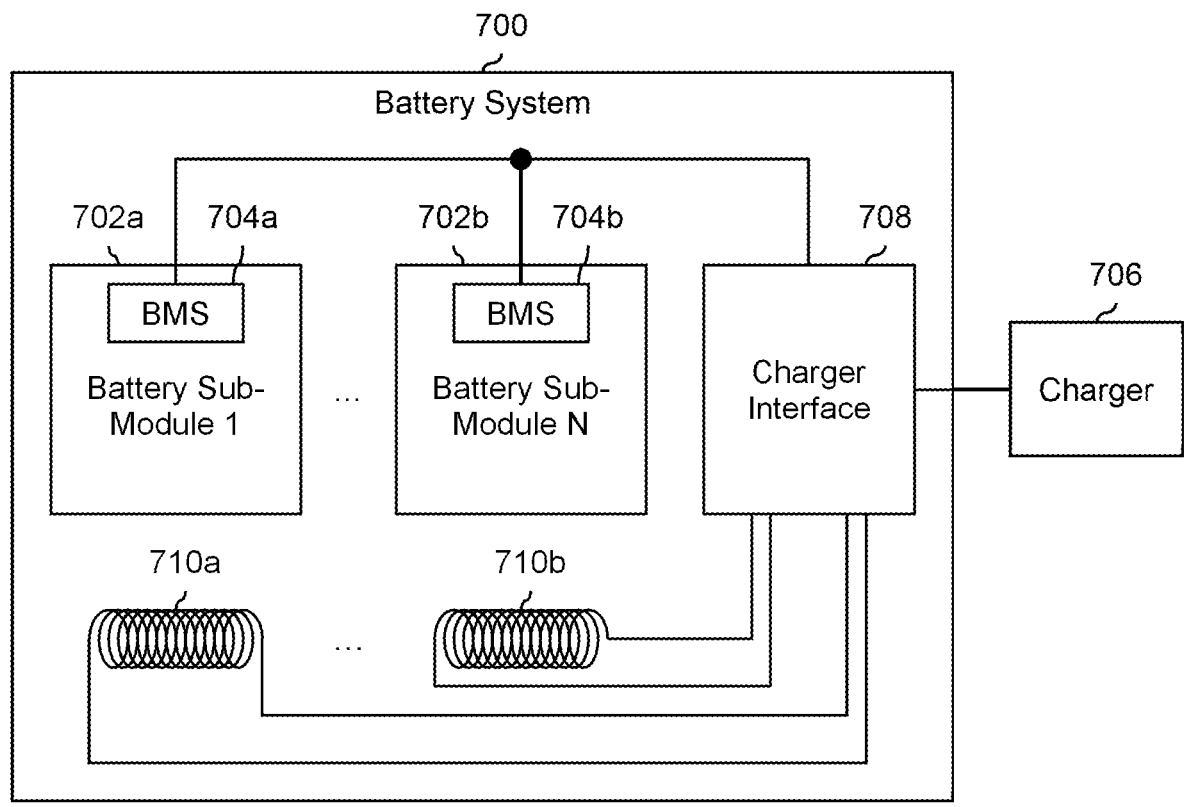
FIG. 7 is a diagram illustrating an embodiment of heating coils in a battery system.

FIG. 7 is a diagram illustrating an embodiment of heating coils in a battery system. For clarity, some components which are not related to heating are not shown here (e.g., the diodes in each of the battery sub-modules are not shown, nor is the common power bus). In this example, the battery system (700) includes a plurality of battery sub-modules (702a and 702b), each of which includes a battery management system (704a and 704b) which (among other things) reports the temperature of the corresponding battery sub-module. The temperatures are passed to the charger (706) via the charger interface (708).

If the temperature of a battery sub-module is too low, the charger will not charge that battery sub-module (e.g., as described above). Any battery sub-modules which are too cold for charging may be heated by turning on the corresponding heating coil (710a and 710b). The heating coils in this example are independently controllable so that (if desired) only certain heating coils are turned on. Charger 706 decides which heating coils to turn on (if any) and so instructs the charger interface 708 which in turn turns on the specified heating coils (if any). Similarly, the temperatures of the battery sub-modules are monitored by the battery management systems and a heating coil can be turned off when its corresponding battery sub-module is sufficiently warm.

In some embodiments, there is an external heating or cooling source. The following figure shows an example where the charger includes a heating and cooling system which enables hot or cold air to be blown across the battery sub-modules.

Figure 8:
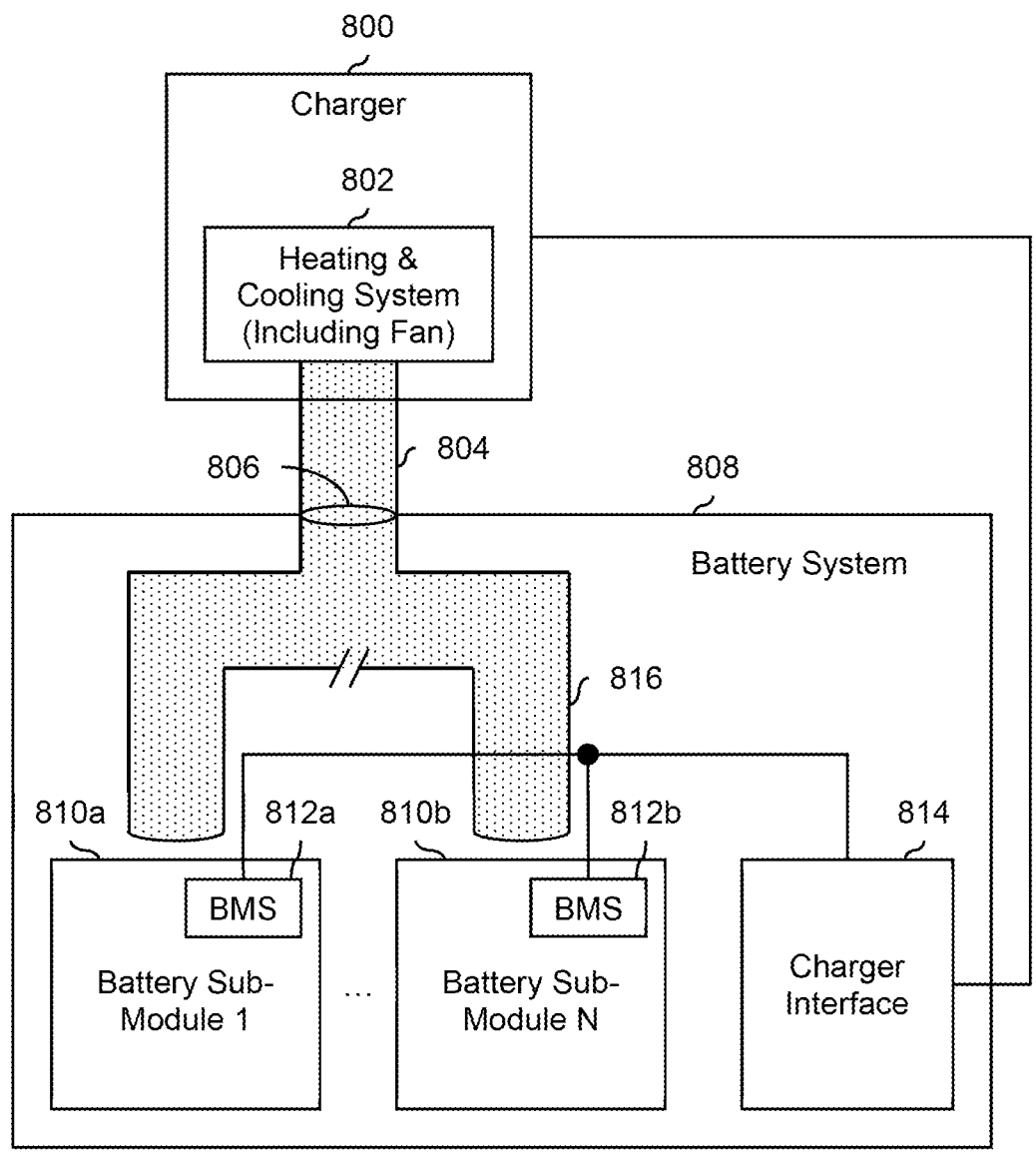
FIG. 8 is a diagram illustrating an embodiment of a charger with a heating and cooling system, including fans.

FIG. 8 is a diagram illustrating an embodiment of a charger with a heating and cooling system, including fans. In this example, the charger (800) includes a heating and cooling system (802). The charger has a hose (804) which is coupled to a port (806) in the battery system (808) which in turn is connected to air ducts (816) with outlets at the battery sub-modules (810a and 810b). This allows hot or cold air from the heating and cooling system (which has at least one fan) to blow over the battery sub-modules. If the battery sub-modules are too hot, then cold air can be blown over them. If the battery sub-modules are too cold, then hot air can be blown over them. As described above, the temperature of each battery sub-module is continuously or periodically monitored by the battery management systems (812a and 812b) which upload their temperatures to the charger (800) via the charger interface (814). When a battery sub-module's temperature reaches an acceptable temperature range, the hot or cold air piped to that battery sub-module is stopped.

For simplicity, only a single hose (804), port (806), and duct (810) are shown in this example. In some embodiments, there are multiple hoses, ports, and/or ducts so that each battery sub-module can, independent of the other battery sub-modules, have hot air, cold air, or no air blown over it.

The following figures describe these examples more formally and/or generally in flowcharts.

Figure 9:
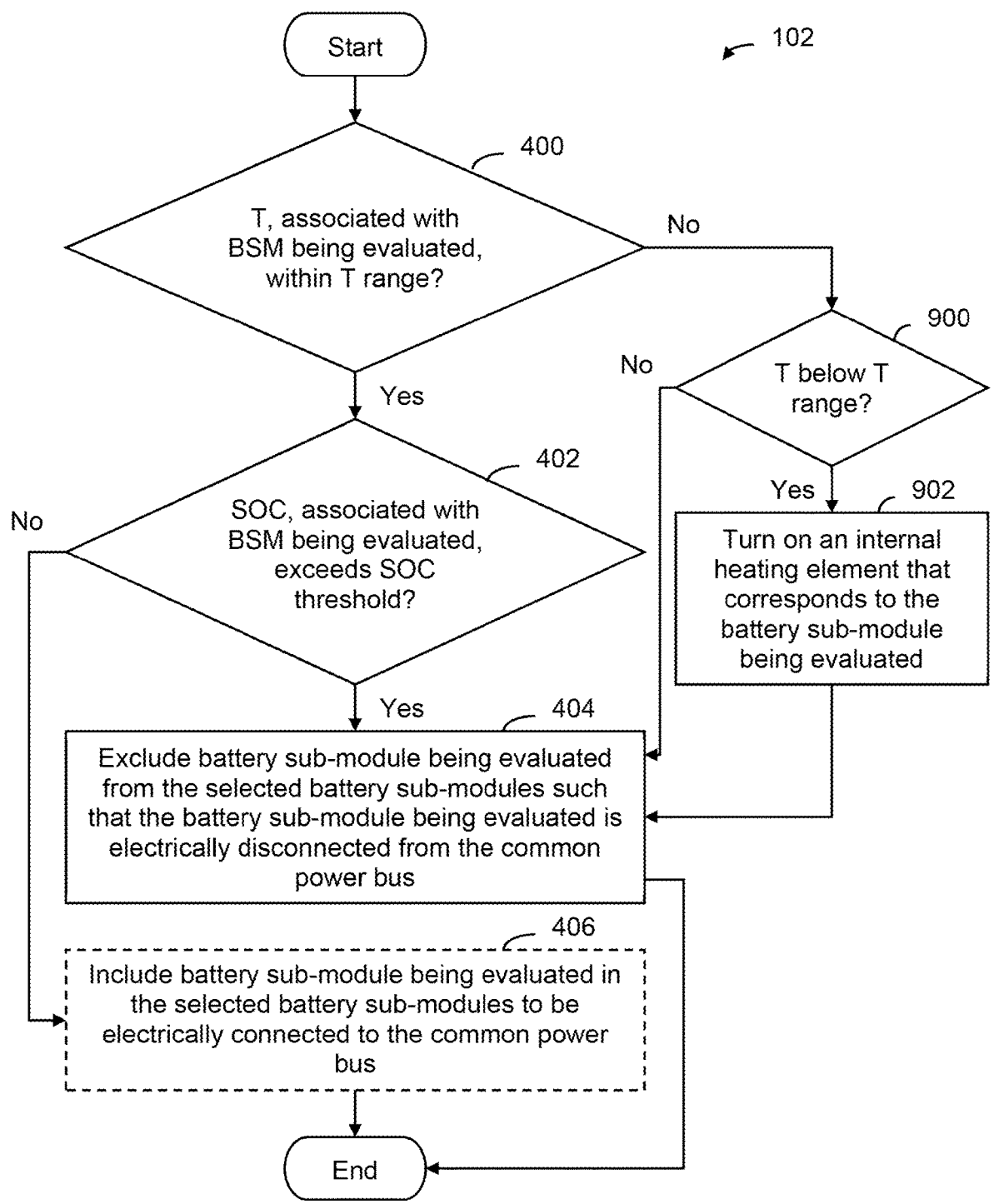
FIG. 9 is a flowchart illustrating an embodiment of a process to turn on an internal heating element as needed.

FIG. 9 is a flowchart illustrating an embodiment of a process to turn on an internal heating element as needed. FIG. 9 is similar to FIG. 4 and for convenience the same reference numbers are used to show related steps. In some embodiments, the process of FIG. 9 is used at step 102 in FIG. 2.

At 400, it is determined whether a temperature, associated with a battery sub-module (BSM) being evaluated, is within a temperature range.

If it is determined that the temperature is within the temperature range at step 400, then at 402 it is determined whether a state of charge (SOC), associated with the battery sub-module (BSM) being evaluated, exceeds a state of charge threshold.

If it is determined that the temperature is outside of the temperature range at step 400, it is determined at 900 if the temperature is below the temperature range (e.g., the battery sub-module is too cold). If so, an internal heating element that corresponds to the battery sub-module being evaluated is turned on at 902. For example, if battery sub-module 702a in FIG. 7 is too cold to be charged safely, then heating coil 710a is turned on. When the temperature reaches the (acceptable) temperature range, that battery sub-module can be electrically connected to the power bus and charged.

After turning on the internal heating element at 902 or if the temperature is not below the temperature range at 900, the battery sub-module being evaluated is excluded from the selected battery sub-modules such that the battery sub-module being evaluated is electrically disconnected from the common power bus at 404.

If it is determined that the state of charge does not exceed the state of charge threshold at 402, the battery sub-module being evaluated is included in the selected battery sub-modules to be electrically connected to the common power bus at 406. As described above, there may be other checks performed and step 406 may not necessarily be performed in some cases.

Figure 10:
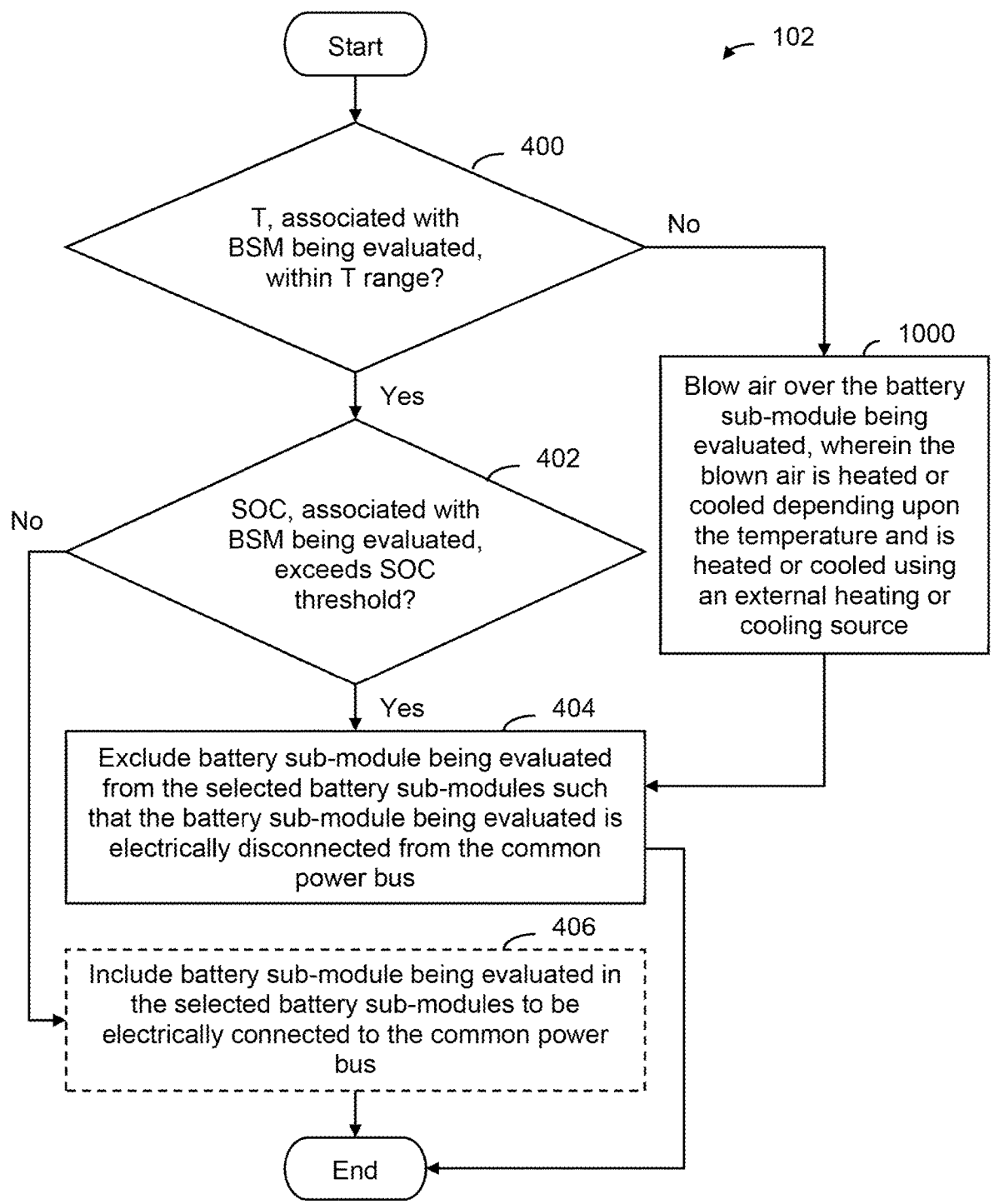
FIG. 10 is a flowchart illustrating an embodiment of a process to blow hot or cold air as needed.

FIG. 10 is a flowchart illustrating an embodiment of a process to blow hot or cold air as needed. FIG. 10 is similar to FIG. 4 and for convenience the same reference numbers are used to show related steps. In some embodiments, the process of FIG. 10 is used at step 102 in FIG. 2.

At 400, it is determined whether a temperature, associated with a battery sub-module (BSM) being evaluated, is within a temperature range.

If it is determined that the temperature is within the temperature range at step 400, then at 402 it is determined whether a state of charge (SOC), associated with the battery sub-module (BSM) being evaluated, exceeds a state of charge threshold.

If it is determined that the temperature is outside of the temperature range at step 400, air is blown over the battery sub-module being evaluated, wherein the blown air is heated or cooled depending upon the temperature and is heated or cooled using an external heating or cooling source at 1000. See, for example, FIG. 8 where the charger has a heating and cooling system with a fan (802) and through hose (804), port (806), and duct (810), hot or cold air is blown over the battery sub-modules. In some other embodiments, there are separate or independent hoses, ports, and/or ducts so that each battery sub-module can independently have hot, cold, or no air blown over it.

After blowing air over the battery sub-module being evaluated at 1000, the battery sub-module being evaluated is excluded from the selected battery sub-modules such that the battery sub-module being evaluated is electrically disconnected from the common power bus at 404.

If it is determined that the state of charge does not exceed the state of charge threshold at 402, the battery sub-module being evaluated is included in the selected battery sub-modules to be electrically connected to the common power bus at 406. As described above, there may be other checks performed and step 406 may not necessarily be performed in some cases.

Returning briefly to FIG. 2, the battery sub-modules shown there wear out over time. To ensure that a battery sub-module does not fail at a critical time (e.g., during flight), the battery management systems in some embodiments estimate or otherwise monitor one or more health metrics (e.g., related to the health and/or wear on a particular battery sub-module). In some embodiments, to update a battery health metric, the charger has to charge (or, more generally, stimulate) the battery sub-modules in a particular manner so that the battery management systems can measure or otherwise estimate battery health metric(s). The following figures show an example of this.

Figure 11A:
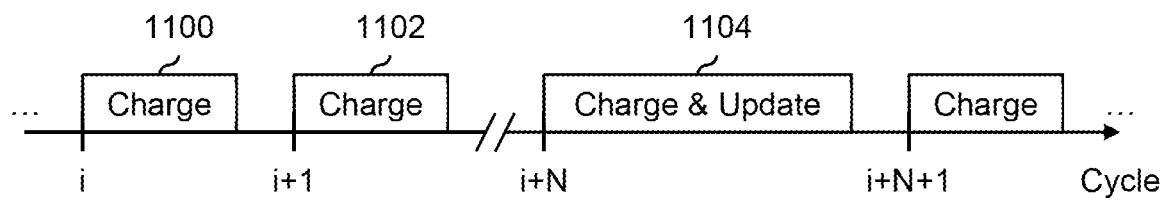
FIG. 11A is a diagram illustrating an embodiment where health metrics are updated on a periodic basis.

FIG. 11A is a diagram illustrating an embodiment where health metrics are updated on a periodic basis. In this example, the axis shows the cycle or index number associated with the charging of a battery sub-module; some cycles are charging-only cycles and other cycles are charge-and-update cycles.

At the $i^{th}$ cycle (1100), a charge-only process is performed where the battery system is charged but the health metrics (e.g., associated with the battery sub-modules) are not updated. At the next cycle (1102), a charge-only process is again performed where the battery system is charged but the health metrics are not updated. During these charge-only cycles (1100 and 1102), the charging process described in FIG. 5 and Equations 1-4 is used.

This pattern continues until the $(i+N)^{th}$ cycle (1104) when the charger charges the battery system and exercises or otherwise stimulates the battery system in a manner that permits or is otherwise conducive to updating the health metrics. In other words, health metrics are updated with a frequency of once every N charging cycles.

Alternatively, instead of updating the health metrics of the various battery sub-modules on a periodic (e.g., fixed) basis, in some embodiments the health metrics are updated when some state or condition is met. For example, if a battery sub-module was recently in a fault condition (e.g., a battery sub-module is suspected to be damaged and its health metric, which presumably was generated before the damage, is therefore out-of-date) or a battery sub-module was just replaced (e.g., so there is no health metric), it may be desirable to perform an update right away instead of waiting for the next periodic update in order to ascertain the cell health.

Returning briefly to FIG. 2, in some embodiments, the charger (200) communicates with the charger interface (222) as needed to let the charger interface know if a charge-only cycle is being performed or if a charge-and-update cycle is being performed. Similarly, the charger may communicate with a charger interface if/when needed to indicate when certain stages have been achieved and the battery management systems should perform certain operations (e.g., when to update state of charge, update C0, etc.).

The following figure describes an example of a charge-and-update process which is used during cycle 1104.

Figure 11B:
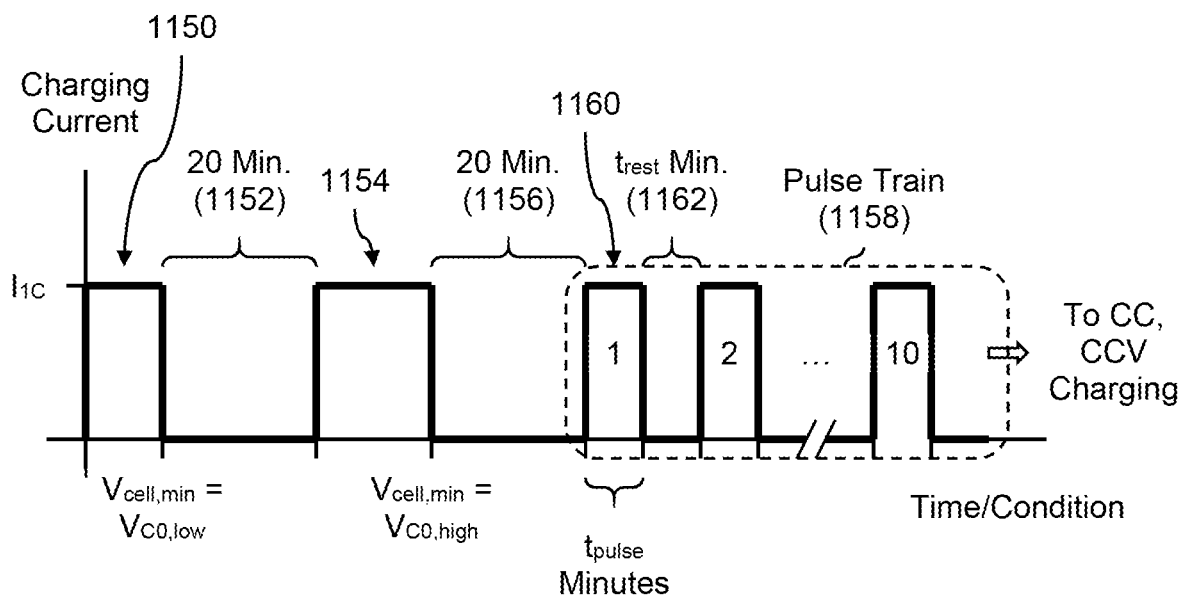
FIG. 11B is a diagram illustrating an embodiment of a charge-and-update process.

FIG. 11B is a diagram illustrating an embodiment of a charge-and-update process. In this example, the x-axis corresponds to a time or condition and the y-axis corresponds to charging current (e.g., output by charger 200 in FIG. 2). In some embodiments, the charge-and-update process shown here is used during charge-and-update cycle 1104 in FIG. 11A. As described above, such a charge-and-update process may be performed on a periodic basis or when certain conditions are met (e.g., if $V_{cell,max}$ drops below $V_{SOH,init}$).

The process begins at 1150 by outputting a charging current of $I_{1C}$ which is the current output by a (e.g., single) battery sub-module at 1 C. In one example, $I_{1C}$=14.7 A. The charging current is held at this level until $V_{cell,min}=V_{C0,low}$ where $V_{cell,min}$ is the global minimum cell voltage (see, e.g., metric 318 in FIG. 3) and $V_{C0,low}$ is the threshold for the first state of charge (e.g., a percentage) measurement point. For example, $V_{C0,low}$=3.75V.

Once the $V_{C0,low}$ threshold is reached, the process waits for 20 minutes (1152), during which time the charging current drops to 0A and the state of charge is measured for a first time. The 20 minute mark is an arbitrary and/or exemplary time to ascertain a cell's open circuit voltage. The cell's measured circuit voltage has a capacitance-like effect where it continues to fluctuate long after current stimulus has disappeared. In this example, it takes approximately 20 minutes until the cell voltage is considered to be in a relaxed state such that the cell's measured voltage can be expected to correspond to its open circuit voltage.

Technically, the state of charge is calculated based off of the open circuit voltage, which is the quantity actually being measured here.

Then, the process sets the charging current to $I_{1C}$ (1154). The charging current is held at that level until $V_{cell,min}=V_{C0,high}$ where $V_{C0,low}$ is the threshold for the second state of charge measurement point. For example, $V_{C0,high}$=4.1V.

Once the $V_{C0,high}$ threshold is reached, the process again waits for 20 minutes (1156), during which time the charging current drops to 0A and the state of charge is measured for a second time.

The process then performs a pulse train (1158) which includes 10 pulses. Each pulse has a sequence or pattern where the charging current is held at $I_{1C}$ for $t_{pulse}$ amount of time 1160, following by a rest period (1162) where the charging current goes to zero for tress amount of time. In one example, $t_{pulse}$=5 seconds and $t_{rest}$=60 seconds. During this time, the two states of charge obtained during waiting periods 1152 and 1156 are used during the pulse train (1158) to obtain the cells' internal resistance. As described above, there are a plurality of battery sub-modules and each battery sub-module includes a plurality of cells. If too many cells have a increased internal resistance then the battery sub-module may need to be replaced. In some embodiments, each battery management system updates the C0 metrics for all of the cells in that particular battery sub-module during the pulse train (1158). For example, battery management system 220a in FIG. 2 would update the C0 metrics for all of the cells in the first battery sub-module (212a), battery management system 220b would update the C0 metrics for all of the cells in the $N^{th}$ battery sub-module (212b), etc.

Once the pulse train has completed and the C0 health metrics have been updated, the process performs constant current, constant cell voltage charging. For example, the charging process described in FIG. 5 and Equations 1-4 is used.

In some embodiments, balancing is only permitted during a constant current, constant cell voltage charging and is not permitted during when the health metrics are being updated (e.g., during periods 1150-1158).

Generally speaking, the charger attempts to output current and/or voltage signals which the battery sub-module(s) would respond to. For example, the battery sub-modules can be modeled as RC circuits and the stimuli provided by the charger attempts to stimulate the battery sub-modules to allow for identification and/or measurement of the parameters (e.g., the resistance(s) and capacitance(s) associated with the RC circuit).

This example is described more formally and/or generally in the flowchart below.

Figure 12:
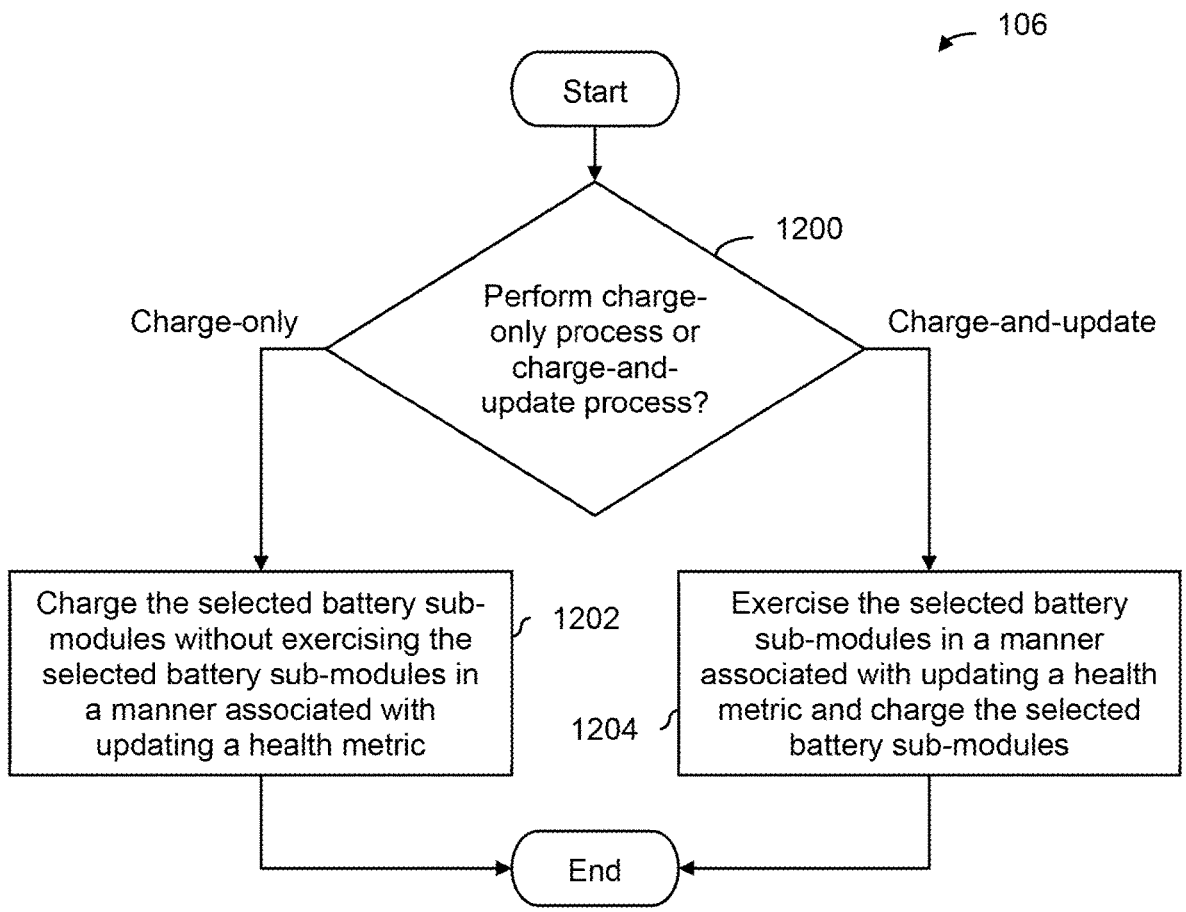
FIG. 12 is a flowchart illustrating an embodiment of a process to charge a battery system using either a charge-only process or a charge-and-update process.

FIG. 12 is a flowchart illustrating an embodiment of a process to charge a battery system using either a charge-only process or a charge-and-update process. In some embodiments, the process of FIG. 12 is used during step 106 of FIG. 1. In some embodiments, the process is performed by a charger.

At 1200, it is determined whether to perform a charge-only process or a charge-and-update process. In some embodiments, the charge-and-update process is periodically performed and the decision at 1200 includes determining if a current index or cycle number is associated with the charge-and-update process. See, for example, FIG. 11A. In some embodiments, the decision at 1200 includes determining if a maximum cell voltage (e.g., $V_{cell,max}$) from the plurality of metrics drops below an update threshold voltage (e.g., $V_{SOH,init}$). For example, $V_{cell,max}$ is one of the metrics in FIG. 3 (see metric 310). In some embodiments, the decision at step 1200 takes into account user input (e.g., so that someone can override a slower charging process in favor of a faster charging process if there is a queue of vehicles at the charger waiting to be charged).

If it is decided at step 1200 to perform the charge-only process, then at 1202 the selected battery sub-modules are charged without exercising the selected battery sub-modules in a manner associated with (e.g., conducive to) updating a health metric. The process described in FIG. 5 and Equations 1-4 describe one such example.

If it is decided at step 1200 to perform the charge-and-update process, then at 1204 the selected battery sub-modules are exercised in a manner associated with (e.g., conducive to) updating a health metric and the selected battery sub-modules are charged. See, for example, FIG. 11B. In some embodiments, the health metric being updated is a cell charge capacity (e.g., C0) and updated charge capacity values are generated for each cell in the battery system.

As described above, in some embodiments step 1202 includes charging the selected battery sub-modules over a first charging period and a second charging period, wherein the durations of the first charging period and the second charging period are based at least in part on a global minimum cell voltage (e.g., $V_{cell,min}$) from the plurality of metrics. More specifically, the first charging period ends when the global minimum cell voltage (e.g., $V_{cell,min}$) reaches a threshold associated with a first state of charge measurement point (e.g., $V_{C0,low}$) and the second charging period ends when the global minimum cell voltage (e.g., $V_{cell,min}$) reaches a threshold associated with a second state of charge measurement point (e.g., $V_{C0,low}$). When those conditions are satisfied, an update state of charge is measured (e.g., twice, once when the first condition is met and again when the second condition is met) and the updated state of charge values are used to obtain an updated C0 value.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a power bus;
a plurality of battery sub-modules connected to the power bus;
a charger interface coupled to the plurality of battery sub-modules;
a charger coupled to the charger interface and configured to:
  charge one or more of the plurality of battery sub-modules;
  receive, via the charger interface, a plurality of metrics associated with the plurality of battery sub-modules, wherein the plurality of metrics include a first metric associated with a first battery sub-module;
  minimize a charging time of the first battery sub-module based on the first metric via the charger interface.

2. The system of claim 1, wherein charger is further configured to:
select a first set of battery sub-modules among the plurality of battery sub-modules based on the metrics associated with the one or more battery sub-modules, wherein the first set of battery sub-modules are determined to collectively charge faster than remaining battery sub-modules; and
charge the first set of battery sub-modules.

3. The system of claim 1, wherein the plurality of metrics are dynamic values that are received periodically from the plurality of battery sub-modules with a frequency of once every one or more charging cycles.

4. The system of claim 1, wherein the plurality of metrics are received periodically from the plurality of battery sub-modules when a predetermined event occurs.

5. The system of claim 1, further comprising:
a battery management system coupled to each one of the plurality of battery sub-modules, wherein a first battery management system coupled to the first battery sub-module is configured to estimate or measure the first metric for the first battery sub-module.

6. The system of claim 1, further comprising:
a battery management system coupled to each one of the plurality of battery sub-modules, wherein a given battery management system coupled to a given battery sub-module is configured to detect that the given battery sub-module is in a fault state, and inform the charger that the given battery sub-module is in the fault state.

7. The system of claim 6, wherein charger is further configured to:
disconnect the given battery sub-module from the power bus.

8. The system of claim 1, wherein the plurality of metrics include one or more of a temperature, a state of charge, a maximum cell voltage, and a minimum current associated with each battery sub-module among the plurality of battery sub-modules.

9. The system of claim 1, wherein the plurality of metrics include a set of metrics associated with each battery sub-module, wherein a charging state for a given battery sub-module is based on a totality of the set of metrics associated with the given battery sub-module.

10. The system of claim 1, wherein the charger is further configured to:
charge the plurality of battery sub-modules in a constant current state mode where the charger maintains a charging current value at a predetermined constant charging current;
determine that a maximum cell voltage for a given battery sub-module among the plurality of battery sub-modules reached a threshold value; and
switch from the constant current state mode to a constant cell voltage state mode where the charger sets the charging current value to a value to maintain the maximum cell voltage at a predetermined value.

11. The system of claim 1, wherein the charger is further configured to:
stop charging the plurality of battery sub-modules when a charging current value of the charger drops to a predetermined value.

12. The system of claim 1, wherein the charger is further configured to:
stop charging the plurality of battery sub-modules when a charging time exceeds a predetermined threshold.

13. The system of claim 1, wherein the charger is further configured to:
determine a minimum battery sub-module current, wherein the minimum battery sub-module current is lowest among battery sub-module currents associated with the plurality of battery sub-modules;
charge the plurality of battery sub-modules at a first charging current set based on at least the minimum battery sub-module current;
obtain a global maximum cell voltage, wherein the global maximum cell voltage is highest among maximum cell voltages associated with the plurality of battery sub-modules; and
charge the plurality of battery sub-modules at a second charging current set based on at least the global maximum cell voltage until the global maximum cell voltage exceeds a threshold value.

14. The system of claim 1, further comprising:
a heating and cooling system associated with one or more battery sub-modules,
wherein the charger is further configured to:
  receive a temperature of a given battery sub-module among the plurality of battery sub-modules;
  determine that the temperature of the given battery sub-module is outside a predetermined range; and
  activate the heating and cooling system via the charger interface to heat or cool the given battery sub-module; and
  start charging the given battery sub-module when the temperature of the given battery sub-module is within the predetermined range.

15. The system of claim 14, wherein the heating and cooling system includes one or more heating coils associated with one or more battery sub-modules.

16. The system of claim 1, wherein the charger is further configured to:
determine a given battery sub-module with a state of charge that is at a target maximum cell voltage; and
discharge the given battery sub-module.

17. A system, comprising:
a power bus;
a plurality of battery sub-modules connected to the power bus;
a charger interface coupled to the plurality of battery sub-modules;

a charger coupled to the charger interface and configured to:
determine a minimum battery sub-module current, wherein the minimum battery sub-module current is lowest among battery sub-module currents associated with the plurality of battery sub-modules;
charge the plurality of battery sub-modules at a first charging current set based on at least the minimum battery sub-module current;
obtain a global maximum cell voltage, wherein the global maximum cell voltage is highest among maximum cell voltages associated with the plurality of battery sub-modules; and
charge the plurality of battery sub-modules at a second charging current set based on at least the global maximum cell voltage until the global maximum cell voltage exceeds a threshold value.

18. The system of claim 17, wherein the charger is further configured to:
stop charging the plurality of battery sub-modules when a charging current value of the charger drops to a predetermined value or when a charging time exceeds a predetermined threshold.

19. A system, comprising:
a power bus;
a plurality of battery sub-modules connected to the power bus;
a charger interface coupled to the plurality of battery sub-modules;
a charger coupled to the charger interface and configured to:
charge the plurality of battery sub-modules in a constant current state mode where the charger maintains a charging current value at a predetermined constant charging current;
determine that a maximum cell voltage for a given battery sub-module among the plurality of battery sub-modules reached a threshold value; and
switch from the constant current state mode to a constant cell voltage state mode where the charger sets the charging current value to a value to maintain the maximum cell voltage at a predetermined value.

20. The system of claim 19, wherein the charger is further configured to: stop charging the plurality of battery sub-modules when a charging current value of the charger drops to a predetermined value or when a charging time exceeds a predetermined threshold.

* * * * *